（12） United States Patent
Su et al.

(10) Patent No.: US 8,947,136 B2
(45) Date of Patent: Feb. 3, 2015

(54) SYSTEMS AND METHODS OF SIGNAL SYNCHRONIZATION FOR DRIVING LIGHT EMITTING DIODES

(71) Applicant: On-Bright Electronics (Shanghai) Co., Ltd., Shanghai (CN)

(72) Inventors: Yongsheng Su, Shanghai (CN); Liqiang Zhu, Shanghai (CN); Qiang Luo, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/945,770

(22) Filed: Jul. 18, 2013

(65) Prior Publication Data

US 2013/0300465 A1 Nov. 14, 2013

Related U.S. Application Data

(63) Continuation of application No. 13/367,088, filed on Feb. 6, 2012, now Pat. No. 8,519,754.

(30) Foreign Application Priority Data

Dec. 31, 2011 (CN) .......................... 2011 1 0461570

(51) Int. Cl.
*H03L 7/00* (2006.01)
*H05B 33/08* (2006.01)
(52) U.S. Cl.
CPC .............. *H03L 7/00* (2013.01); *H05B 33/0815* (2013.01); *Y02B 20/346* (2013.01)
USPC ......................................... 327/141; 327/109

(58) Field of Classification Search
USPC .......................... 327/108, 109, 141, 144, 145
See application file for complete search history.

(56) References Cited

U.S. PATENT DOCUMENTS 4,717,868 A * 1/1988 Peterson ....................... 323/288
5,113,086 A * 5/1992 Cho .............................. 327/176
(Continued)

FOREIGN PATENT DOCUMENTS

| CN | 1573893 A | 2/2005 |
| CN | 1848687 A | 10/2006 |
| TW | I343040 | 6/2011 |
| TW | 201129229 | 8/2011 |

OTHER PUBLICATIONS

Chinese Patent Office, Office Action mailed Aug. 21, 2014, in Application No. 201110461570.7.

(Continued)

*Primary Examiner* — William Hernandez
(74) *Attorney, Agent, or Firm* — Jones Day

(57) ABSTRACT

System and method for signal synchronization. The system includes a first selection component, a first signal generator, a second signal generator and a first gate drive component. The first selection component is configured to receive a first mode signal and generate a first selection signal based on at least information associated with the first mode signal. The first signal generator is configured to, if the first selection signal satisfies one or more first conditions, receive a first input signal and generate at least a first clock signal based on at least information associated with the first input signal. Furthermore, the first gate drive component is configured to, if the first selection signal satisfies the one or more first conditions, receive at least the first clock signal and output a first drive signal to a first switch.

22 Claims, 10 Drawing Sheets

(56) References Cited

U.S. PATENT DOCUMENTS

| | | | |
|---|---|---|---|
| 5,233,337 A * | 8/1993 | Takahashi | 345/82 |
| 2003/0076314 A1 | 4/2003 | Kang | |
| 2010/0085295 A1 | 4/2010 | Zhao et al. | |

OTHER PUBLICATIONS

Taiwanese Patent Office, Office Notice of Allowance mailed Jun. 30, 2014, in Application No. 101105124.

* cited by examiner

SYSTEMS AND METHODS OF SIGNAL SYNCHRONIZATION FOR DRIVING LIGHT EMITTING DIODES

1. CROSS-REFERENCES TO RELATED APPLICATIONS

This application is a continuation of U.S. patent application Ser. No. 13/367,088, filed Feb. 6, 2012, which claims priority to Chinese Patent Application No. 201110461570.7, filed Dec. 31, 2011, both applications being commonly assigned and incorporated by reference herein for all purposes.

2. BACKGROUND OF THE INVENTION

The present invention is directed to integrated circuits. More particularly, the invention provides systems and methods for signal synchronization. Merely by way of example, the invention has been applied to light-emitting-diode (LED) drivers. But it would be recognized that the invention has a much broader range of applicability.

In LED back-lighting applications, such as TV with liquid crystal display (LCD), multiple LED drivers often are used to drive multiple LED strings. However, the LED drivers usually have different switching frequencies from each other, which may result in audio noises and/or screen flickers. Hence, synchronization of the LED drivers often is needed to reduce audio noises and/or screen flickers.

LED drivers with lower switching frequencies usually are synchronized with LED drivers with higher switching frequencies. But this scheme often suffers from issues related to un-defined ramping ranges. For example, slope compensation is often needed to make a control loop stable in a continuous current mode. If multiple LED drivers operate at the same switching frequency, the magnitudes of slope compensation in different LED drivers should be the same in order to provide the same switching duty cycle and achieve system stability and LED current precision. But the accuracy of slope compensation usually depends on semiconductor-process variations and component mismatches. Hence, the slope compensation can vary significantly from integrated-circuit (IC) chip to chip. Even though components trimming can be used to reduce the effect of the semiconductor-process variations and component mismatches, such trimming usually is applicable to only fixed frequency operations with increased costs.

Hence it is highly desirable to improve the techniques of synchronizing LED drivers.

3. BRIEF SUMMARY OF THE INVENTION

The present invention is directed to integrated circuits. More particularly, the invention provides systems and methods for signal synchronization. Merely by way of example, the invention has been applied to light-emitting-diode (LED) drivers. But it would be recognized that the invention has a much broader range of applicability.

According to one embodiment, a system for signal synchronization includes a first selection component, a first signal generator, a second signal generator, and a first gate drive component. The first selection component is configured to receive a first mode signal and generate a first selection signal based on at least information associated with the first mode signal, the first selection signal indicating a first operation mode. The first signal generator configured to, if the first selection signal satisfies one or more first conditions, receive a first input signal and generate at least a first clock signal based on at least information associated with the first input signal, the first input signal including a first input rising edge and being associated with a first input frequency, the first clock signal including a first clock rising edge and being associated with a first clock frequency. The second signal generator configured to, if the first selection signal satisfies one or more second conditions, generate at least a second clock signal, the second clock signal including a second clock rising edge and being associated with a second clock frequency. Additionally, the first gate drive component configured to, if the first selection signal satisfies the one or more first conditions, receive at least the first clock signal and output a first drive signal to a first switch based on at least information associated with the first clock signal. Further, the first gate drive component configured to, if the first selection signal satisfies the one or more second conditions, receive at least the second clock signal and output a second drive signal to the first switch based on at least information associated with the second clock signal. In addition, the first input frequency and the first clock frequency are the same. The first input rising edge and the first clock rising edge both correspond to a first time. Moreover, the one or more second conditions are different from the one or more first conditions.

According to another embodiment, a method for signal synchronization includes receiving a mode signal, processing information associated with the mode signal, and generating a selection signal based on at least information associated with the mode signal, the selection signal indicating an operation mode. Additionally, the method includes if the selection signal satisfies one or more first conditions, receiving an input signal, processing information associated with the input signal, and generating at least a first clock signal based on at least information associated with the input signal, the input signal including a first input rising edge and being associated with a first input frequency, the first clock signal including a first clock rising edge and being associated with a first clock frequency. The method further includes receiving at least the first clock signal, processing information associated with the first clock signal, and outputting a first drive signal to a first switch based on at least information associated with the first clock signal. Moreover, the method includes, if the selection signal satisfies one or more second conditions, generating at least a second clock signal, the second clock signal including a second clock rising edge and being associated with a second clock frequency, receiving at least the second clock signal, processing information associated with the second clock signal, and outputting a second drive signal to the first switch based on at least information associated with the second clock signal. Furthermore, the first input frequency and the first clock frequency are the same, and the first input rising edge and the first clock rising edge both correspond to a first time. The one or more second conditions are different from the one or more first conditions.

Many benefits are achieved by way of the present invention over conventional techniques. For example, some embodiments of the present invention synchronize a number of LED drivers to a clock signal generated by a master LED driver or other external sources. In another example, each LED driver to generate a fixed-duty-cycle slope-compensation signal adaptively. Certain embodiments of the present invention enable the LED drivers to work at any switching frequency. As an example, no component trimming is needed for synchronizing the LED drivers.

Depending upon embodiment, one or more benefits may be achieved. These benefits and various additional objects, features and advantages of the present invention can be fully

4. BRIEF DESCRIPTION OF THE DRAWINGS

5. DETAILED DESCRIPTION OF THE INVENTION

The present invention is directed to integrated circuits. More particularly, the invention provides systems and methods for signal synchronization. Merely by way of example, the invention has been applied to light-emitting-diode (LED) drivers. But it would be recognized that the invention has a much broader range of applicability.

Figure 1A:
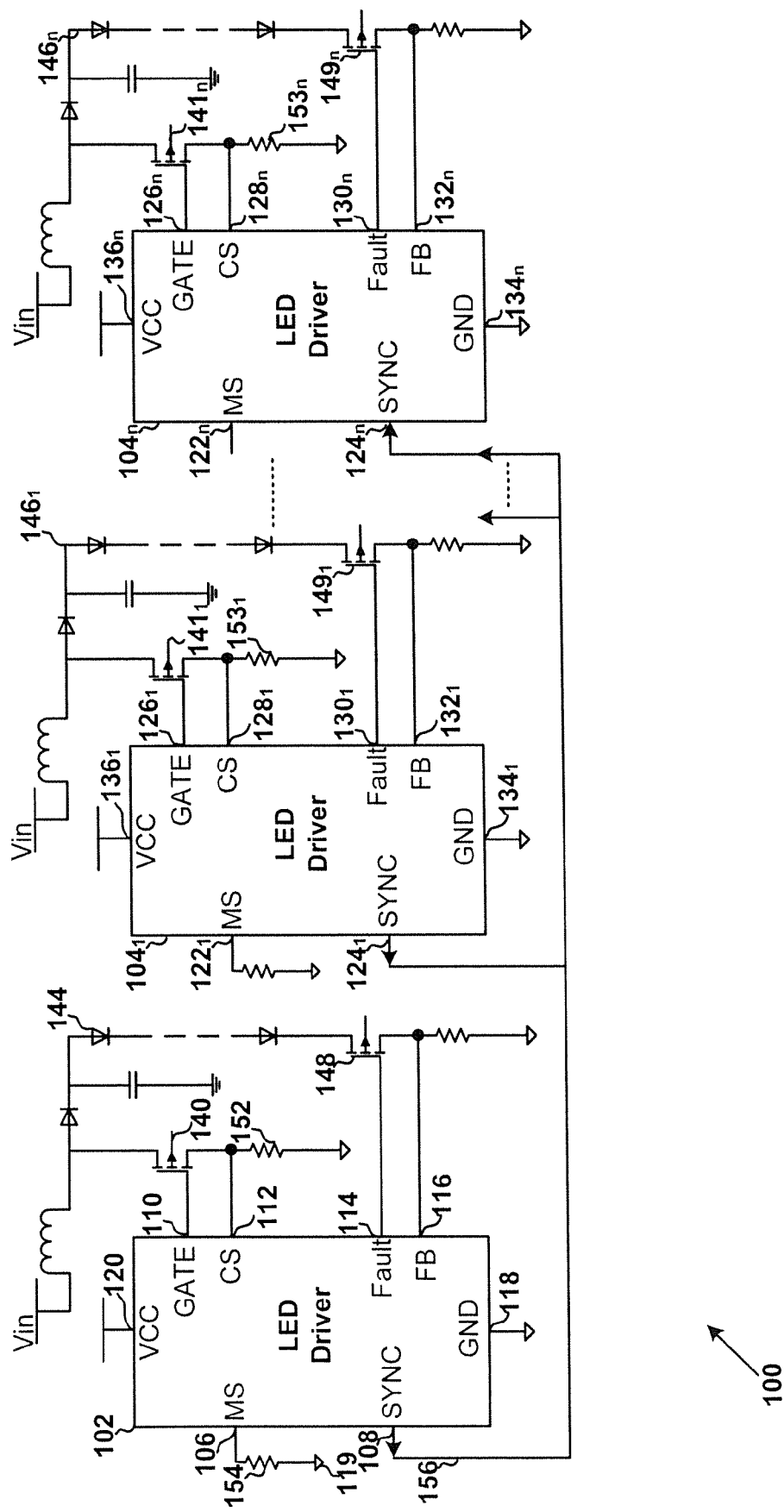
FIG. 1(a) is a simplified diagram showing a system for synchronizing multiple LED drivers based on a clock signal generated by a master LED driver according to one embodiment of the present invention.

FIG. 1(a) is a simplified diagram showing a system for synchronizing multiple LED drivers based on a clock signal generated by a master LED driver according to one embodiment of the present invention. This diagram is merely an example, which should not unduly limit the scope of the claims. One of ordinary skill in the art would recognize many variations, alternatives, and modifications.

The system 100 includes multiple LED drivers 102, $104_1, \ldots, 104_n$, and LED strings 144, $146_1, \ldots, 146_n$. n is an positive integer. The LED driver 102 includes terminals 106 (e.g., MS), 108 (e.g., SYNC), 110 (e.g., GATE), 112 (e.g., CS), 114 (e.g., Fault), 116 (e.g., FB), 118 (e.g., GND), and 120 (e.g., VCC). Similarly, the LED drivers $104_1, \ldots, 104_n$ include terminals $122_1, \ldots, 122_n$ (e.g., MS), $124_1, \ldots, 124_n$ (e.g., SYNC), $126_1, \ldots, 126_n$ (e.g., GATE), $128_1, \ldots, 128_n$ (e.g., CS), $130_1, \ldots, 130_n$ (e.g., Fault), $132_1, \ldots, 132_n$ (e.g., FB), $134_1, \ldots, 134_n$ (e.g., GND), and $136_1, \ldots, 136_n$ (e.g., VCC), respectively. For example, the switches 140, $141_1, \ldots, 141_n$ are transistors. In another example, the switches 148, $149_1, \ldots, 149_n$ are transistors.

According to one embodiment, a resistor 154 is coupled between the terminal 106 (e.g., MS) and a chip-ground 119, so the LED driver 102 is configured to operate as a master LED driver. For example, an internal clock-signal generator in the LED driver 102 generates at least a clock signal 156 with a K % duty cycle. In yet another example, the signal 156 is output through the terminal 108 (e.g., SYNC). In yet another example, the frequency of the signal 156 depends on the resistance of the resistor 154.

According to another embodiment, the terminals $122_1, \ldots, 122_n$ are floating, and the LED drivers $104_1, \ldots, 104_n$ each are configured to operate as a slave LED driver. For example, internal slave oscillators of the LED drivers $104_1, \ldots, 104_n$ are activated, respectively. In another example, the LED drivers $104_1, \ldots, 104_n$ receive the clock signal 156 at the terminals $124_1, \ldots, 124_n$ (e.g., SYNC), respectively. In yet another example, in response, the LED drivers $104_1, \ldots, 104_n$ generate clock signals that are with the same frequency as the signal 156 for driving the switches $141_1, \ldots, 141_n$, respectively. In yet another example, the generated clock signals are synchronized (e.g., in terms of timing) to the received signal 156.

Figure 1B:
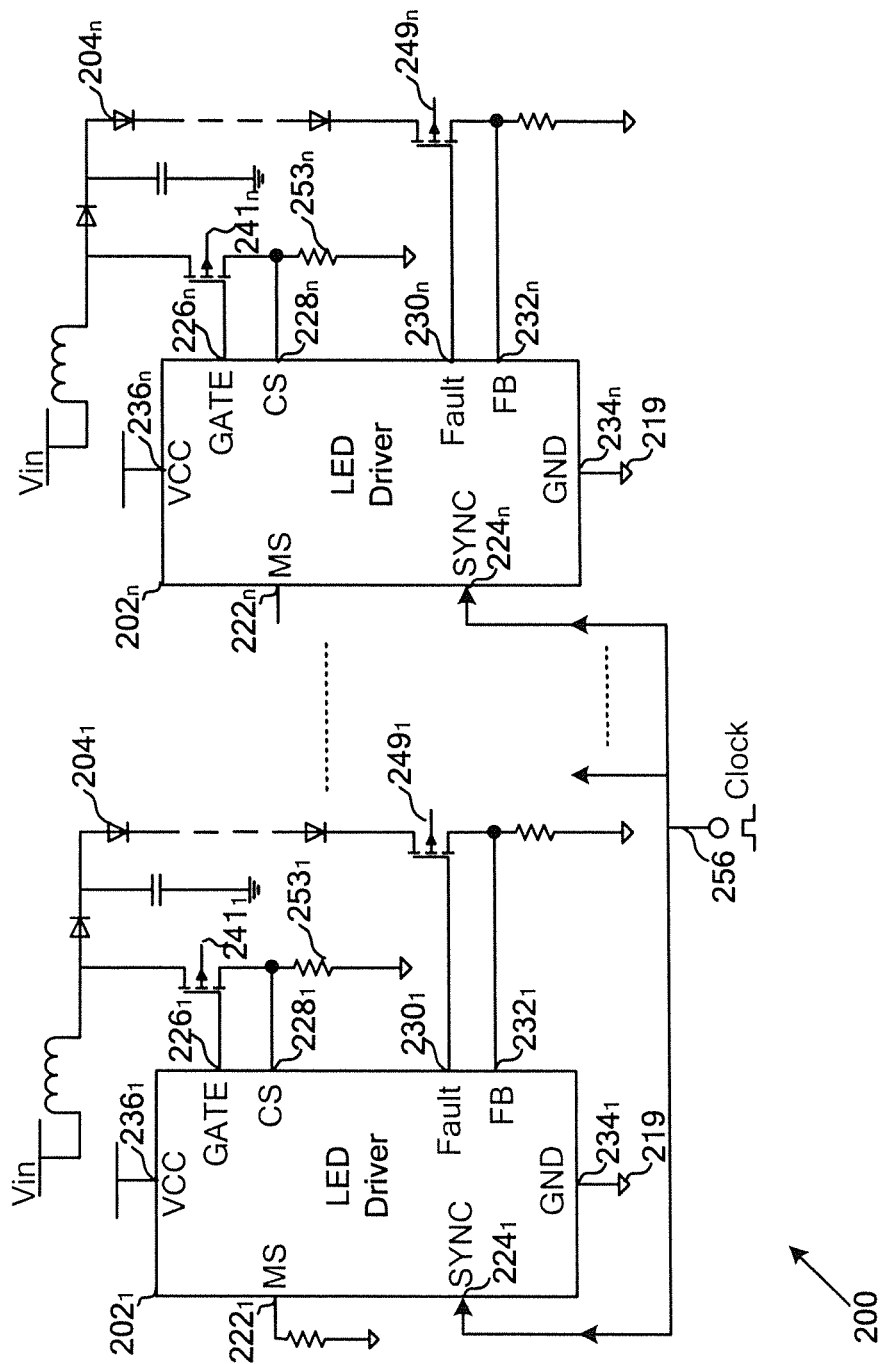
FIG. 1(b) is a simplified diagram showing a system for synchronizing multiple LED drivers based on an external clock signal according to another embodiment of the present invention.

FIG. 1(b) is a simplified diagram showing a system for synchronizing multiple LED drivers based on an external clock signal according to another embodiment of the present invention. This diagram is merely an example, which should not unduly limit the scope of the claims. One of ordinary skill in the art would recognize many variations, alternatives, and modifications.

The system 200 includes multiple LED drivers $202_1, \ldots, 202_n$, and LED strings $204_1, \ldots, 204_n$. n is a positive integer. The LED drivers $202_1, \ldots, 202_n$ include terminals $222_1, \ldots, 222_n$ (e.g., MS), $224_1, \ldots, 224_n$ (e.g., SYNC), $226_1, \ldots, 226_n$ (e.g., GATE), $228_1, \ldots, 228_n$ (e.g., CS), $230_1, \ldots, 230_n$ (e.g., Fault), $232_1, \ldots, 232_n$ (e.g., FB), $234_1, \ldots, 234_n$ (e.g., GND), and $236_1, \ldots, 236_n$ (e.g., VCC), respectively. For example, the switches $241_1, \ldots, 241_n$ are transistors. In yet another example, the switches $249_1, \ldots, 249_n$ are transistors.

According to one embodiment, the terminals $222_1, \ldots, 222_n$ are floating, and the LED drivers $202_1, \ldots, 202_n$ are each configured to operate as a slave LED driver. For example, internal slave oscillators of the LED drivers $202_1, \ldots, 202_n$ are activated. In another example, the LED drivers $202_1, \ldots, 202_n$ receive an external clock signal 256 (e.g., Clock) at the terminals $224_1, \ldots, 224_n$ (e.g., SYNC), respectively. In yet another example, in response, the LED drivers $202_1, \ldots, 202_n$ generate clock signals that are with the same frequency as the external clock signal 256 (e.g., Clock) for driving the switches $241_1, \ldots, 241_n$, respectively. In yet another example, the generated clock signals are synchronized (e.g., in terms of timing) to the external clock signal 256.

Figure 2:
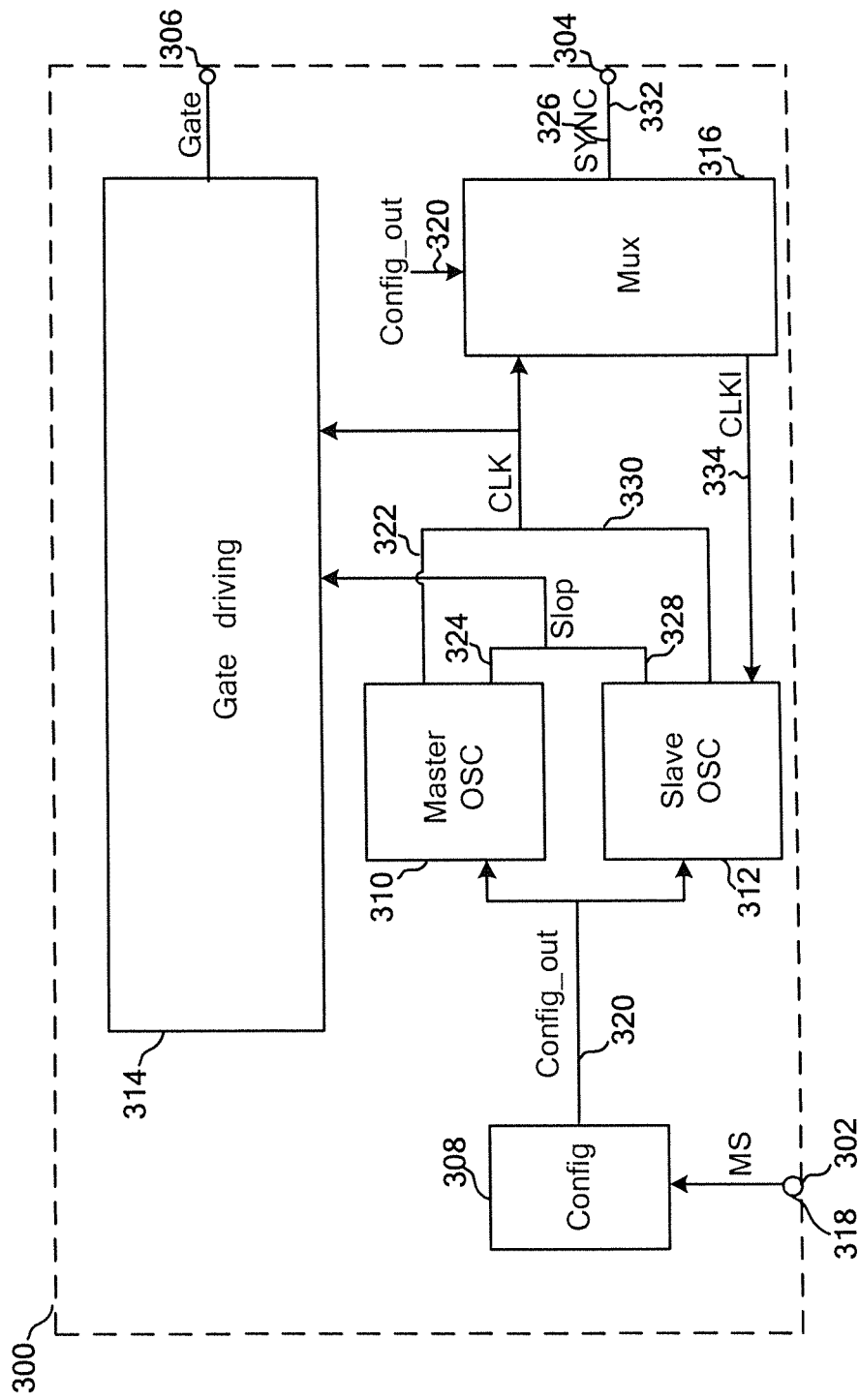
FIG. 2 is a simplified diagram showing certain components of an LED driver as part of the system as shown in FIG. 1(a) or the system as shown in FIG. 1(b) according to one embodiment of the present invention.

FIG. 2 is a simplified diagram showing certain components of an LED driver as part of the system 100 or the system 200 according to one embodiment of the present invention. This diagram is merely an example, which should not unduly limit the scope of the claims. One of ordinary skill in the art would recognize many variations, alternatives, and modifications.

The LED driver 300 includes three terminals 302, 304 and 306, a selection component 308, a master oscillator 310, a slave oscillator 312, a gate driving component 314, and a multiplexer 316. For example, each of the LED driver 102, 104$_1$, ..., 104$_n$ is the same as the LED driver 300. In another example, each of the LED driver 202$_1$, ..., or 202$_n$ is the same as the LED driver 300.

According to one embodiment, if a resistor is coupled between the terminal 302 (e.g., MS) and a chip ground of the LED driver 300 (not shown in FIG. 2), the LED driver 300 is configured as a master LED driver. For example, the selection component 308 receives a signal 318 from the terminal 302 (e.g., MS) and generates a selection signal 320 (e.g., Config_out). In another example, the selection signal 320 is at a logic high level which indicates that the LED driver 300 is in the master mode. In yet another example, in response to the selection signal 320, the master oscillator 310 is activated and the slave oscillator 312 enters a power-down mode. In yet another example, the master oscillator 310 outputs a clock signal 322 and a slope signal 324 to the gate driving component 314 for driving LED strings. In yet another example, the slope signal 324 ramps up at a time corresponding to a rising edge of the clock signal 322. In yet another example, the slope signal 324 reduces in magnitude to a low value (e.g., 0) at a time corresponding to a falling edge of the clock signal 322.

According to another embodiment, in response to the selection signal 320 that indicates that the LED driver 300 is configured as a master LED driver, the multiplexer 316 receives the clock signal 322 and outputs a signal 326 to other LED drivers that are configured as slave LED drivers via the terminal 304 (e.g., SYNC). For example, the signal 326 serves as an external clock signal to which other slave LED drivers can be synchronized. In another example, the clock signal 322 has a same frequency as the signal 326. In yet another example, a rising edge of the clock signal 322 and a rising edge of the signal 326 appear at a same time. In yet another example, the duty cycle of the clock signal 322 is different from that of the signal 326. In yet another example, the duty cycle of the clock signal 322 is the same as that of the signal 326. In yet another example, the slope signal 324 has a same amplitude as slope signals generated by the salve LED drivers that are synchronized to the LED driver 300. In yet another example, the slope signal 324 ramps up at the same time as slope signals generated by the slave LED drivers that are synchronized to the LED driver 300. In yet another example, the slope signal 324 reduces in magnitude to a low value (e.g., 0) at the same time as the slope signals generated by the slave LED drivers that are synchronized to the LED driver 300.

If the terminal 302 (e.g., MS) is floating (e.g., not coupled to a resistor), the LED driver 300 is configured as a slave LED driver according to certain embodiments. For example, the selection signal 320 generated by the selection component 308 is at a logic low level which indicates that the LED driver 300 is in the slave mode. In another example, in response to the selection signal 320, the slave oscillator 312 is activated and the master oscillator 310 enters a power-down mode. In yet another example, the multiplexer 316 receives an external clock signal 332 and outputs a signal 334 (e.g., CLKI) to the slave oscillator 312. In yet another example, in response to the signal 334, the slave oscillator 312 outputs a clock signal 330 and a slope signal 328 to the gate driving component 314 for driving LED strings. In yet another example, the slope signal 328 ramps up at a time corresponding to a rising edge of the clock signal 330. In yet another example, the slope signal 328 reduces in magnitude to a low value (e.g., 0) at a time corresponding to a falling edge of the clock signal 330. In yet another example, the signal 334 is the same as the external clock signal 332. In yet another example, the clock signal 330 has a same frequency as the external clock signal 332. In yet another example, a rising edge of the clock signal 330 and a rising edge of the external clock signal 332 appear at a same time. In yet another example, the duty cycle of the clock signal 330 is different from that of the external clock signal 332. In yet another example, the duty cycle of the clock signal 330 is the same as that of the external clock signal 332. In yet another example, the slope signal 328 has a same amplitude as slope signals generated by other slave LED drivers that are synchronized based on the external clock signal 332 or synchronized to a master LED driver that provides the external clock signal 332. In yet another example, the slope signal 328 ramps up at the same time as slope signals generated by other slave LED drivers that are synchronized based on the external clock signal 332 or synchronized to a master LED driver that provides the external clock signal 332. In yet another example, the slope signal 328 reduces in magnitude to a low value (e.g., 0) at the same time as the slope signals generated by other slave LED drivers that are synchronized based on the external clock signal 332 or synchronized to a master LED driver that provides the external clock signal 332.

Figure 3:
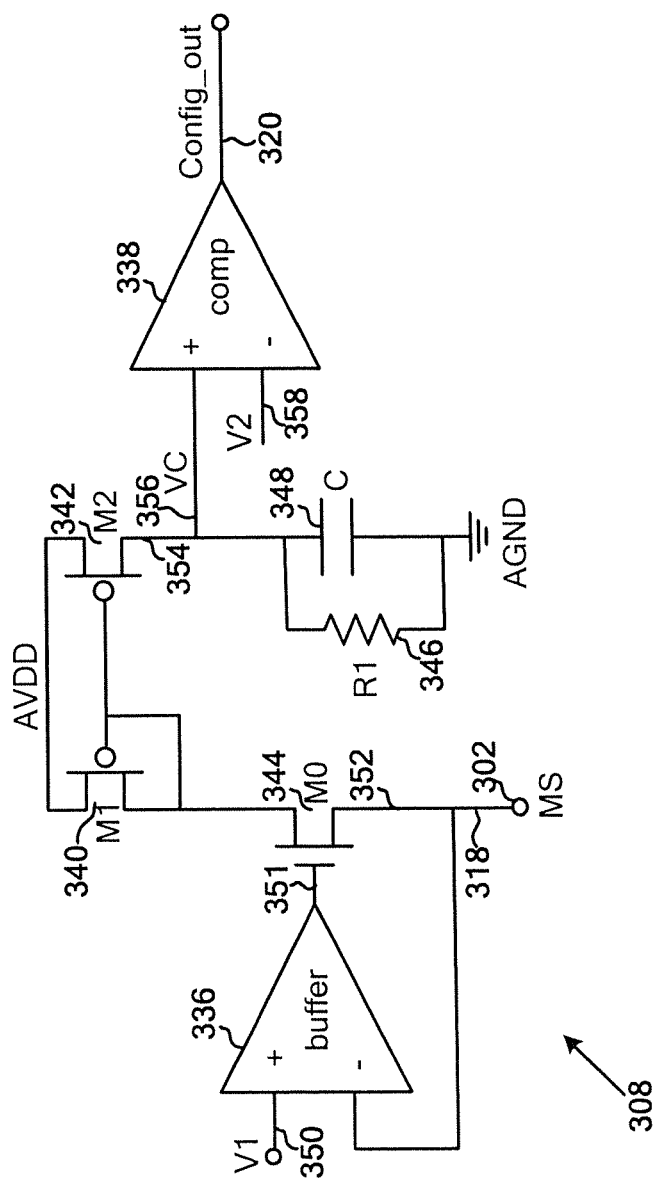
FIG. 3 is a simplified diagram showing certain components of the selection component as part of the LED driver as shown in FIG. 2 according to one embodiment of the present invention.

FIG. 3 is a simplified diagram showing certain components of the selection component 308 as part of the LED driver 300 according to one embodiment of the present invention. This diagram is merely an example, which should not unduly limit the scope of the claims. One of ordinary skill in the art would recognize many variations, alternatives, and modifications.

The selection component 308 includes a buffer amplifier 336, a comparator 338, three transistors 340, 342 and 344, a resistor 346, and a capacitor 348. For example, the transistors 340 and 342 are P-channel field-effect transistors (FETs). In another example, the transistor 344 is a N-channel FET.

According to one embodiment, if the LED driver 300 is powered up, the selection signal 320 is initialized to the logic low level. For example, if a resistor (e.g., the resistor 154 as shown in FIG. 1(a)) is coupled between the terminal 302 (e.g., MS) and the chip ground of the LED driver 300, the buffer amplifier 336 receives the signal 318 at an inverting terminal and a reference signal 350 at a non-inverting terminal. In another example, the buffer amplifier 336 outputs a signal 351 to turn on the transistor 344. In yet another example, a current 352 flows through the transistors 344 and 340. In yet another example, the current 352 is mirrored by the transistor 342, with a predetermined ratio α, to generate a current 354. In yet another example, the current 354 charges the capacitor 348 to ramp up a voltage 356 (e.g., VC) at a terminal of the capacitor 348. In yet another example, the comparator 338 receives the voltage 356 at a non-inverting terminal and the threshold voltage 358 at an inverting terminal. In yet another example, if the voltage 356 exceeds a threshold voltage 358 in magnitude, the comparator 338 changes the selection signal 320 from the logic low level to the logic high level that indicates the LED driver 300 is configured as a master LED driver.

According to another embodiment, if the terminal 302 (e.g., MS) is floating, there is no or little current flowing through the transistors 340 and 344. For example, there is no current flowing through the transistor 354 to charge the capacitor 348. In another example, if the voltage 356 (e.g., VC) is lower than the threshold voltage 358 in magnitude, the comparator 338 outputs the selection signal 320 at the logic low level that indicates the LED driver 300 is configured as a slave LED driver.

A slave LED driver often needs to provide slope compensation of a same duty cycle as a master LED driver. But as shown in FIG. 3, a slave LED driver usually receives an external clock signal 332 either from a master LED driver or other external sources. The frequency of the external clock signal 332 is often not fixed. The slope signal 328 usually needs to track the frequency of the external clock signal 332.

Figure 4A:
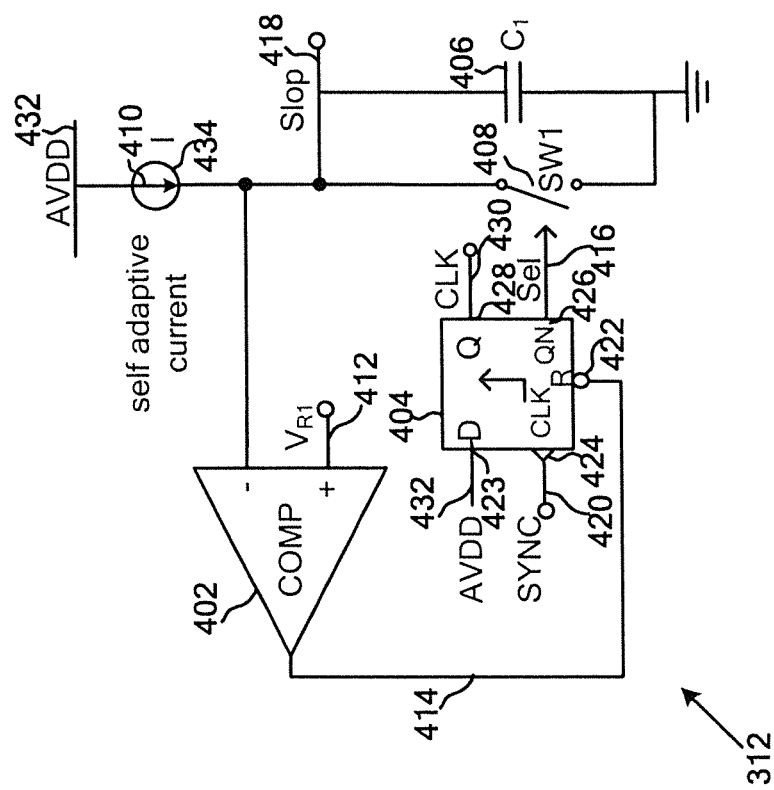
FIG. 4(a) is a simplified diagram showing certain components of the slave oscillator as part of the LED driver as shown in FIG. 2 according to one embodiment of the present invention.

FIG. 4(a) is a simplified diagram showing certain components of the slave oscillator 312 as part of the LED driver 300 according to one embodiment of the present invention. This diagram is merely an example, which should not unduly limit the scope of the claims. One of ordinary skill in the art would recognize many variations, alternatives, and modifications. The slave oscillator 312 includes an adaptive current generator 434, a comparator 402, a D flip-flop 404, a capacitor 406, and a switch 408. For example, the switch 408 (e.g., SW1) is a transistor.

According to one embodiment, if the switch 408 is open (e.g., off), an adaptive current 410 (e.g., I) generated by the adaptive current generator 434 charges the capacitor 406 (e.g., C1) to ramp up a voltage signal 418 (e.g., Slop) at one terminal of the capacitor 406. For example, the comparator 402 receives the signal 418 at an inverting terminal and the reference voltage 412 at a non-inverting terminal, and outputs a comparison signal 414 to a terminal 422 (e.g., R) of the D flip-flop 404. In another example, if the signal 418 exceeds the reference voltage 412 in magnitude, the comparison signal 414 is output at a logic low level. In yet another example, the D flip-flop 404 is reset in response to the comparison signal 414. In yet another example, the D flip-flop 404 outputs a selection signal 416 (e.g., SEL) at a terminal 426 (e.g., QN), and in response, the switch 408 is closed (e.g., on). In yet another example, the capacitor 406 discharges through the closed switch 408, and the voltage signal 418 decreases in magnitude to a low value (e.g., 0). In yet another example, if the voltage signal 418 reduces in magnitude to be lower than the reference voltage 412 in magnitude, the comparator 402 outputs the comparison signal 414 at a logic high level. In yet another example, the D flip-flop 404 is set in response to the comparison signal 414.

According to another embodiment, the D flip-flop 404 receives a voltage signal 432 (e.g., AVDD) at a terminal 423 (e.g., D). For example, if a rising edge of an input signal 420 (e.g., SYNC) arrives at a terminal 424 of the D flip-flop 404, the D flip-flop 404 outputs, at a terminal 428 (e.g., Q), a clock signal 430 (e.g., CLK) that tracks the voltage signal 432 (e.g., AVDD). In another example, the clock signal 430 is at the logic high level, and the selection signal 416 is at the logic low level. In yet another example, in response, the switch 408 is opened (e.g., off), and the adaptive current 410 charges the capacitor 406 again. In yet another example, the clock signal 430 (e.g., CLK) has a same frequency as the input signal 420 (e.g., SYNC). In yet another example, the duty cycle of the clock signal 430 (e.g., CLK) is the same as or different from that of the input signal 420 (e.g., SYNC). In yet another example, the input signal 420 (e.g., SYNC) represents an external clock signal from a master LED driver or other external sources.

According to yet another embodiment, the adaptive current 410 can be determined based on the following equation.

$$I_{self} = \frac{100}{K} \times C_1 \times V_{R1} \times f_{SYNC} \quad \text{(Equation 1)}$$

where $I_{self}$ represents the adaptive current 410, $C_1$ represents the capacitance of the capacitor 406, and $V_{R1}$ represents the reference voltage 412. Additionally, $f_{SYNC}$ represents the frequency of the input signal 420, and 100/K represents a ratio. As shown in Equation 1, the adaptive current 410 is proportional to the frequency of the input signal 420 in magnitude.

Figure 4B:
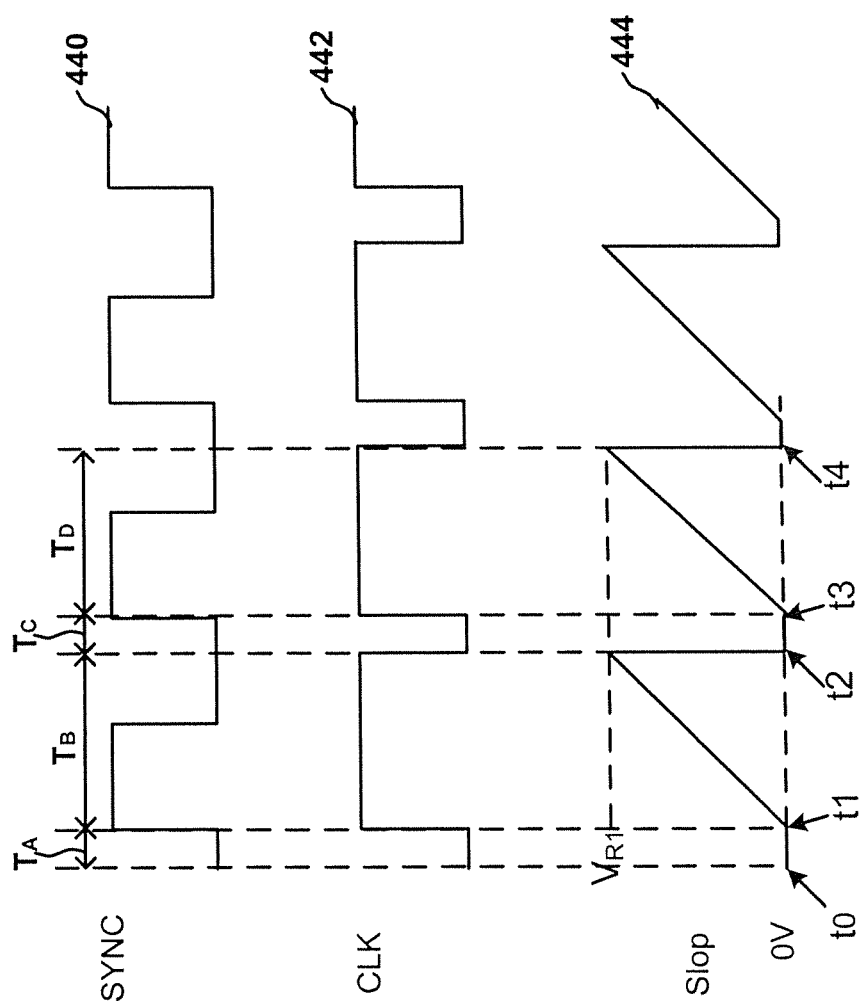
FIG. 4(b) is a simplified timing diagram for the slave oscillator as shown in FIG. 4(a) according to one embodiment of the present invention.

FIG. 4(b) is a simplified timing diagram for the slave oscillator 312 as shown in FIG. 4(a) according to one embodiment of the present invention. This diagram is merely an example, which should not unduly limit the scope of the claims. One of ordinary skill in the art would recognize many variations, alternatives, and modifications. The waveform 440 represents the input signal 420 as a function of time, the waveform 442 represents the clock signal 430 as a function of time, and the waveform 444 represents the voltage signal 418 as a function of time.

Four time periods $T_A$, $T_B$, $T_C$, and $T_D$ are shown in FIG. 4(b). The time period $T_A$ starts at time $t_0$ and ends at time $t_1$, the time period $T_B$ starts at time $t_1$ and ends at time $t_2$, the time period $T_C$ starts at time $t_2$ and ends at time $t_3$, and the time period $T_D$ starts at time $t_3$ and ends at time $t_4$. For example, $t_0 \leq t_1 \leq t_2 \leq t_3 \leq t_4$.

According to one embodiment, during the time period $T_A$, the input signal 420 (e.g., SYNC) is at a logic low level as shown by the waveform 440. For example, the clock signal 430 is at the logic low level as shown by the waveform 442. In yet another example, the voltage signal 418 has a low magnitude (e.g., 0) as shown by the waveform 444.

According to another embodiment, at the beginning of the time period $T_B$ (e.g., $t_1$), the input signal 420 (SYNC) changes from the logic low level to the logic high level (e.g., as shown by a rising edge of the waveform 440). For example, in response, the D flip-flop 404 changes the clock signal 430 from the logic low level to the logic high level (e.g., as shown by the waveform 442), and changes the selection signal 416 from the logic high level to the logic low level. In another example, the switch 408 is open (e.g., off), and the adaptive current 410 charges the capacitor 406. In yet another example, the voltage signal 418 ramps up (e.g., as shown by the waveform 444).

According to yet another embodiment, during the time period $T_B$, the adaptive current 410 continues to charge the capacitor 406, and the voltage signal 418 continues to increase in magnitude as shown by the waveform 444. For example, at the end of the time period $T_B$ (e.g., at $t_2$), if the magnitude of the voltage signal 418 exceeds the reference voltage 412 (e.g., $V_{R1}$), the comparator 402 changes the comparison signal 414, and the D flip-flop 404 is reset in response to the comparison signal 414. In another example, the clock signal 430 changes from the logic high level to the logic low level (e.g., as shown by the waveform 442), and the selection signal 416 changes from the logic low level to the logic high level at the end of the time period $T_B$ (e.g., at $t_2$). In yet another example, the switch 408 is closed (e.g., on), and the capacitor 406 discharges through the closed switch 408. In yet another example, the voltage signal 418 decreases in magnitude to a low value (e.g., 0) (e.g., at $t_2$ as shown by the waveform 444).

According to yet another embodiment, during the time period $T_C$, the clock signal 430 remains at the logic low level (e.g., as shown by the waveform 442). For example, the voltage signal 418 has a low magnitude (e.g., 0) as shown by the waveform 444.

A next rising edge of the input signal 420 arrives at the terminal 424 (e.g., CLK) of the D flip-flop 404 at the beginning of the time period $T_D$ (e.g., at $t_3$) as shown by the waveform 440 according to certain embodiments. For example, the clock signal 430 changes from the logic low level to the logic high level again (e.g., as shown by the waveform 442). In another example, the switch 408 is open (e.g., off), and the adaptive current 410 charges the capacitor 406 again. In yet another example, the voltage signal 418 ramps up again (e.g., as shown by the waveform 444).

Figure 5A:
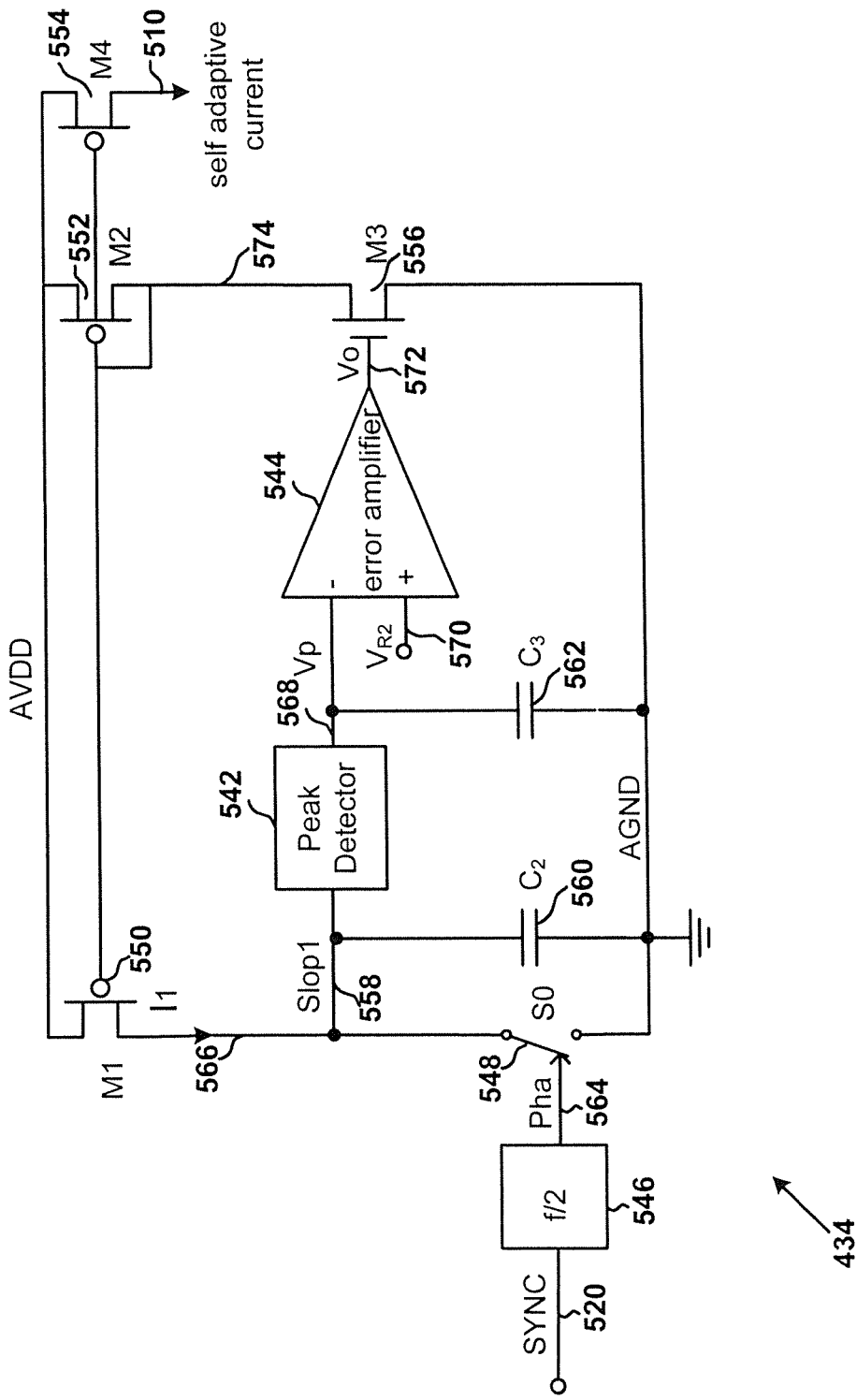
FIG. 5(a) is a simplified diagram showing certain components of the adaptive current generator as part of the slave oscillator in the LED driver as shown in FIG. 2 according to one embodiment of the present invention.

FIG. 5(a) is a simplified diagram showing certain components of the adaptive current generator 434 as part of the slave oscillator 312 in the LED driver 300 according to one embodiment of the present invention. This diagram is merely an example, which should not unduly limit the scope of the claims. One of ordinary skill in the art would recognize many variations, alternatives, and modifications.

The adaptive current generator 434 includes a peak detector 542, an error amplifier 544, a half-frequency component 546, a switch 548, four transistors 550, 552, 554 and 556, and two capacitors 560 and 562. For example, the transistors 550, 552 and 554 are P-channel FETs. In another example, the transistor 556 is a N-channel FET.

According to one embodiment, the half-frequency component 546 receives an input signal 520 (e.g., SYNC), and generates a signal 564 (e.g., Pha). For example, the signal 564 is a 50% duty cycle square wave, and has a frequency that is half of the frequency of the input signal 520. In another example, a rising edge of the signal 564 appears at the same time as that of the input signal 520. In yet another example, if the signal 564 (e.g., Pha) is at a logic low level, the switch 548 (e.g., S0) is open (e.g., off). In yet another example, a current 566 (e.g., I1) that flows through the transistor 550 charges the capacitor 560, and the voltage signal 558 (e.g., Slop1) ramps up.

According to another embodiment, the peak detector 542 detects the voltage signal 548 right before a rising edge of the signal 564 arrives, and outputs a detection signal 568 (e.g., $V_p$) that represents a peak value of the voltage signal 548. For example, the detection signal 568 is stored at the capacitor 562. In another example, the error amplifier 544 receives the detection signal 568 at an inverting input terminal and a reference signal 570 (e.g., $V_{R2}$) at a non-inverting input terminal, and outputs an integrated signal 572 (e.g., $V_o$) to drive the transistor 556. In yet another example, the integrated signal 572 affects a current 574 that flows through the transistors 552 and 556. In yet another example, the current 574 is mirrored by the transistor 550, with a predetermined ratio β, to generate the current 566 (e.g., I1). In yet another example, the integrated signal 572 affects the current 566 through a closed loop. In yet another example, the current 566 is mirrored by the transistor 554, with a predetermined ratio γ, to generate an adaptive current 510.

According to yet another embodiment, the current 566 (e.g., I1) can be determined based on the following equation.

$$I_1 = C_2 \times V_{R2} \times f_{SYNC} \qquad \text{(Equation 2)}$$

where $I_1$ represents the current 566, $C_2$ represents the capacitance of the capacitor 560, $V_{R2}$ represents the reference signal 570, and $f_{SYNC}$ represents the frequency of the input signal 520.

For example, the adaptive current 510 can be determined based on Equation 1. In another example, based on Equation 1 and Equation 2, the ratio between the size of the transistor 554 and the size of the transistor 550 can be determined using the following equation.

$$\frac{(W/L)_{M4}}{(W/L)_{M1}} = \frac{100}{K} \times \frac{C_1 V_{R1}}{C_2 V_{R2}} \qquad \text{(Equation 3)}$$

where $(W/L)_{M1}$ represents the size of the transistor 550, $(W/L)_{M4}$ represents the size of the transistor 554, and $C_1$ represents the capacitance of the capacitor 406. Additionally, $V_{R1}$ represents the reference voltage 412, $C_2$ represents the capacitance of the capacitor 560, $V_{R2}$ represents the reference signal 570, and 100/K represents a ratio.

According to yet another embodiment, the variation of the detection signal 568 (e.g., $V_p$) that represents the peak value of the voltage signal 558 (e.g., Slop1) satisfies the following equation under a stable-loop condition.

$$\frac{\Delta V2}{\Delta V1} = \frac{n \times g_{m3}}{\tau \times C_2 \times f_{SYNC}^2} < 1 \qquad \text{(Equation 4)}$$

where ΔV1 represents the variation of the detection signal 568 (e.g., $V_p$) during a first predetermined period of time $T_0$, ΔV2 represents the variation of the detection signal 568 (e.g., $V_p$) during a second predetermined period of time $T_1$, and n represents the ratio between the size of the transistor 550 and the size of the transistor 554. In addition, $g_{m3}$ represents the conductance of the transistor 556, $C_2$ represents the capacitance of the capacitor 560, $f_{SYNC}$ represents the frequency of the input signal 520, and τ represents the time constant of the error amplifier 544.

For example, the time interval between the first predetermined period of time $T_0$ and the second predetermined period of time $T_1$ is two periods of the input signal 520. In another example, if the frequency of the input signal 520 (e.g., $f_{SYNC}$) is low, the time constant of the error amplifier 544 (e.g., τ) often needs to be large to keep the detection signal 568 approximately equal to the reference signal 570 in magnitude. In yet another example, the time constant of the integrate 544 can be determined based on the following equation.

$$\tau > \frac{n \times g_{m3}}{C_2 \times f_{SYNC}^2} \qquad \text{(Equation 5)}$$

where τ represents the time constant of the error amplifier 544, n represents the ratio between the size of the transistor 550 and the size of the transistor 554, and $g_{m3}$ represents the conductance of the transistor 556. In addition, $C_2$ represents the capacitance of the capacitor 560, and $f_{SYNC}$ represents the frequency of the input signal 520.

Figure 5B:
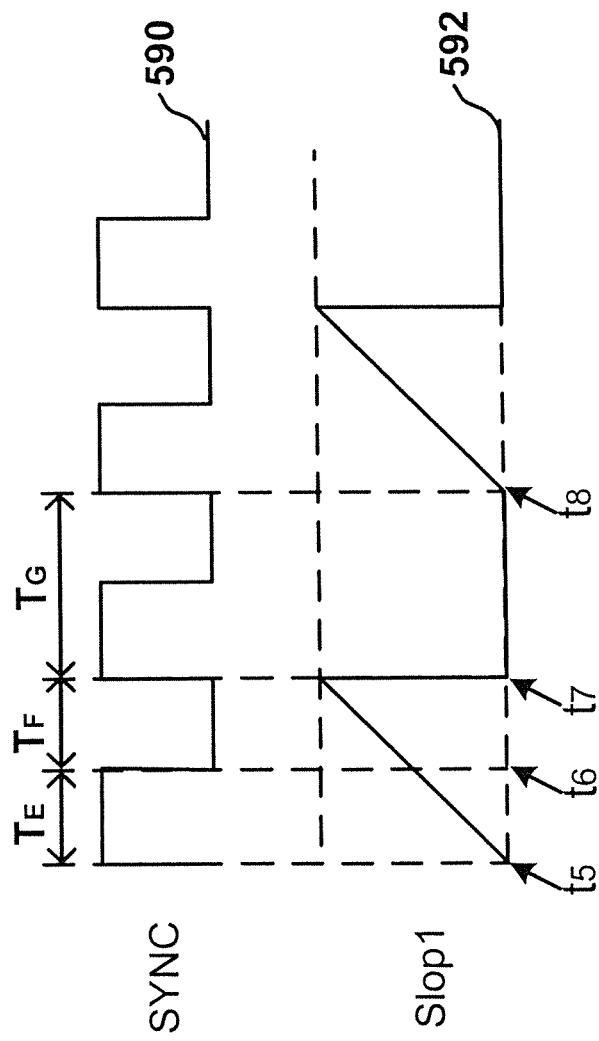
FIG. 5(b) is a simplified timing diagram for the adaptive current generator as shown in FIG. 5(a) according to one embodiment of the present invention.

FIG. 5(b) is a simplified timing diagram for the adaptive current generator 434 as shown in FIG. 5(a) according to one embodiment of the present invention. This diagram is merely an example, which should not unduly limit the scope of the claims. One of ordinary skill in the art would recognize many variations, alternatives, and modifications. The waveform 590 represents the input signal 520 as a function of time, and the waveform 592 represents the voltage signal 558 as a function of time.

Three time periods $T_E$, $T_F$, and $T_G$ are shown in FIG. 5(b). The time period $T_E$ starts at time $t_5$ and ends at time $t_6$, the time period $T_F$ starts at time $t_6$ and ends at time $t_7$, and the time period $T_G$ starts at time $t_7$ and ends at time $t_8$. For example, $t_5 \leq t_6 \leq t_7 \leq t_8$.

According to one embodiment, during the time period $T_E$, the input signal 520 is at a logic high level as shown by the waveform 590. For example, the signal 564 is at a logic low level. In another example, the switch 548 is open (e.g., off), and the current 566 charges the capacitor 560. In yet another example, the voltage signal 558 ramps up (e.g., at $t_5$).

According to another embodiment, the input signal 520 changes from the logic high level to a logic low level at the beginning of the time period $T_F$ (e.g., at $t_6$), and keeps at the logic low level during the time period $T_F$ (e.g., as shown by the waveform 590). For example, the frequency of the signal 564 is about half of the frequency of the input signal 520. In another example, the signal 564 keeps at the logic low level during the time period $T_F$. In yet another example, the switch 548 remains open (e.g., off), and the current 566 continues to charge the capacitor 560. In yet another example, the voltage signal 558 continues to increase in magnitude during the time period $T_F$ (e.g., as shown by the waveform 592).

According to yet another embodiment, at the beginning of the time period $T_G$ (e.g., $t_7$), the input signal 520 changes from the logic low level to the logic high level (e.g., as shown by a rising edge of the waveform 590). For example, the signal 564 changes from the logic low level to the logic high level, and the switch 548 is closed (e.g., on). In another example, the capacitor 560 discharges through the closed switch 548, and the voltage signal 558 decreases in magnitude from a high value (e.g., $V_{R2}$) to a low value (e.g., 0) at the beginning of the time period $T_G$ (e.g., $t_7$) as shown by the waveform 592.

According to yet another embodiment, during the time period $T_G$, the signal 564 keeps at the logic high level, and the switch remains closed (e.g., on). For example, the magnitude of the voltage signal 558 remains at the low value (e.g., 0) as shown by the waveform 592.

If a next rising edge of the input signal 520 (SYNC) arrives (e.g., at $t_8$ as shown by the waveform 590), the signal 564 changes from the logic high level to the logic low level, and the switch 548 is open (e.g., off) again according to certain embodiments. For example, the current 566 charges the capacitor 560 again, and the voltage signal 558 ramps up again (e.g., at $t_8$ as shown by the waveform 592).

Figure 6A:
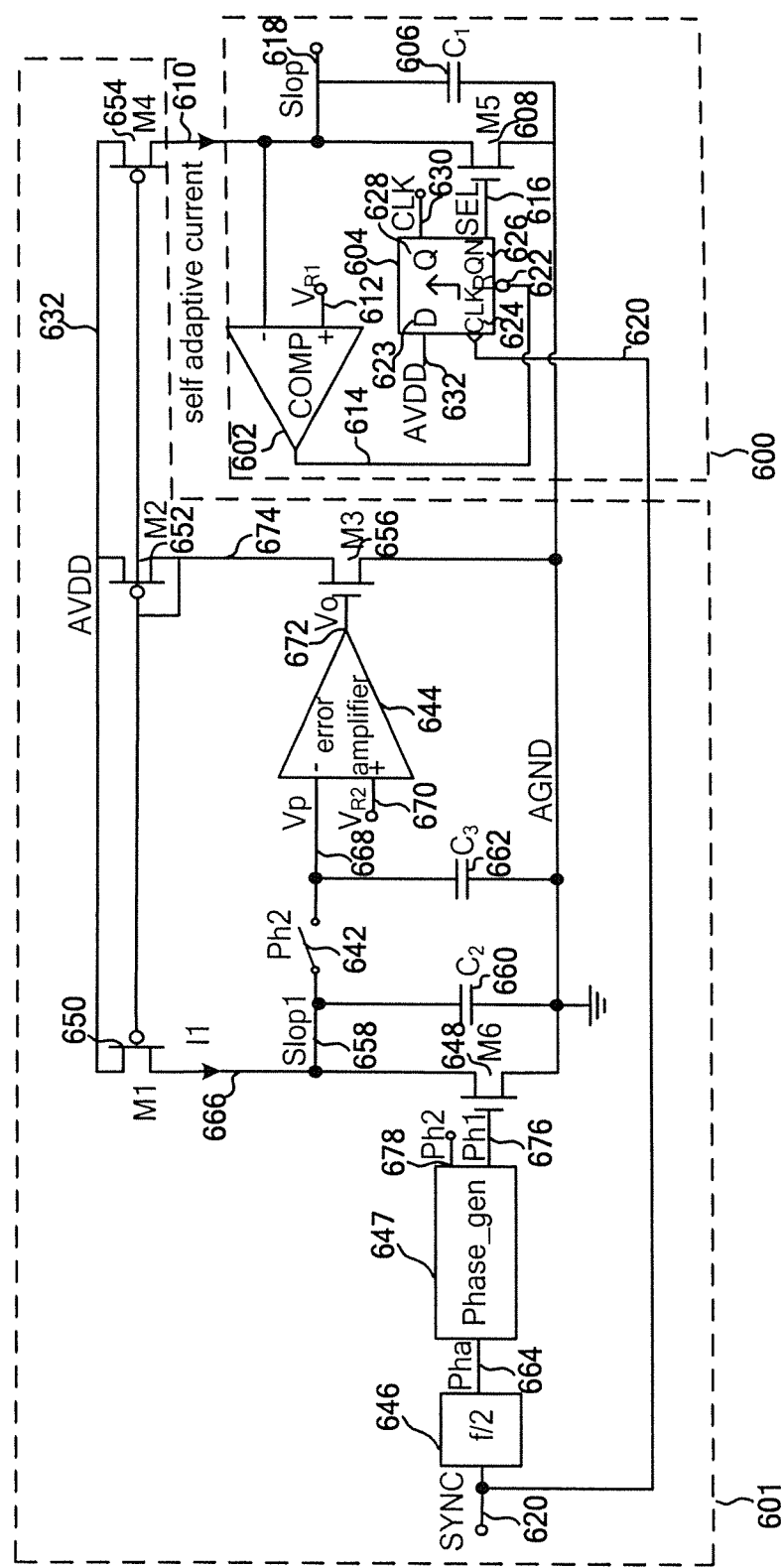
FIG. 6(a) is a simplified diagram showing certain components of the slave oscillator as part of the LED driver as shown in FIG. 2 according to another embodiment of the present invention.

FIG. 6(a) is a simplified diagram showing certain components of the slave oscillator 312 as part of the LED driver 300 according to another embodiment of the present invention. This diagram is merely an example, which should not unduly limit the scope of the claims. One of ordinary skill in the art would recognize many variations, alternatives, and modifications.

The slave oscillator 312 includes a slope signal generator 600 and an adaptive current generator 601. The slope signal generator 600 includes a comparator 602, a D flip-flop 604, a capacitor 606, and a switch 608. The adaptive current generator 601 includes an error amplifier 644, a half-frequency component 646, a phase generator 647, two switches 642 and 648, four transistors 650, 652, 654 and 656, and two capacitors 660 and 662.

For example, the switches 608 and 648 are transistors. In another example, the transistors 650, 652 and 654 are P-channel FETs. In yet another example, the transistor 656 is a N-channel FET. In yet another example, the comparator 602, the D flip-flop 604, the capacitor 606, and the switch 608 are the same as the comparator 402, the D flip-flop 404, the capacitor 406, and the switch 408, respectively. In yet another example, the error amplifier 644, the half-frequency component 646, the switch 648, the transistors 650, 652, 654 and 656, and the capacitors 660 and 662 are the same as the error amplifier 544, the half-frequency component 546, the switch 548, the transistors 550, 552, 554 and 556, and the capacitors 560 and 562, respectively. In yet another example, the phase generator 647 and the switch 642 are used to form the peak detector 542 (e.g., through pulse sampling).

According to one embodiment, the half-frequency component 646 receives an input signal 620 (e.g., SYNC), and generates a signal 664 (e.g., Pha). For example, the signal 664 is a 50% duty cycle square wave, and has a frequency that is half of the frequency of the input signal 620. In another example, a rising edge of the signal 664 appears at the same time as that of the input signal 620. In yet another example, the phase generator 647 receives the signal 664, and outputs a first drive signal 676 (e.g., Ph1) and a second drive signal 678 (e.g., Ph2). In yet another example, the frequency of the first drive signal 676 (e.g., Ph1) is a 50% duty cycle square wave, and has a frequency that is half of the frequency of the input signal 620 (e.g., SYNC). In yet another example, the second drive signal 678 (e.g., Ph2) is a pulse signal with a small pulse width, and has a frequency that is half of the frequency of the input signal 620 (e.g., SYNC).

According to another embodiment, if the first drive signal 676 (e.g., Ph1) is at a logic low level, the switch 648 (e.g., S0) is open (e.g., off). For example, a current 666 (e.g., I1) that flows through the transistor 650 charges the capacitor 660, and the voltage signal 658 (e.g., Slop1) ramps up. In another example, the switch 642 is closed (e.g., on) in response to the second drive signal 678 right before a rising edge of the signal 676.

According to yet another embodiment, the capacitor 662 stores a detection signal 668 (e.g., $V_p$) that represents a peak value of the voltage signal 648. For example, the error amplifier 644 receives the detection signal 668 at an inverting input terminal and a reference signal 670 (e.g., $V_{R2}$) at a non-inverting input terminal, and outputs an integrated signal 672 (e.g., $V_o$) to drive the transistor 656. In another example, the integrated signal 672 affects a current 674 that flows through the transistors 652 and 656. In yet another example, the current 674 is mirrored by the transistor 650, with a predetermined ratio $\delta$, to generate the current 666 (e.g., I1). In yet another example, the integrated signal 672 affects the current 666 through a closed loop. In yet another example, the current 666 is mirrored by the transistor 654, with a predetermined ratio $\epsilon$, to generate an adaptive current 610. In yet another example, the ratio $\delta$ is the same as the ratio $\beta$. In yet another example, the ratio $\epsilon$ is the same as the ratio $\gamma$.

If the switch 608 is open (e.g., off), the adaptive current 610 charges the capacitor 606 (e.g., C1) to ramp up a voltage signal 618 (e.g., Slop) in magnitude according to certain embodiments. For example, the comparator 602 receives the voltage signal 618 at an inverting terminal and the reference voltage 612 at a non-inverting terminal, and outputs a comparison signal 614 to a terminal 622 (e.g., R) of the D flip-flop 604. In yet another example, if the voltage signal 618 exceeds the reference voltage 612 in magnitude, the comparison signal 614 is output at a logic low level. In yet another example, the D flip-flop 604 is reset in response to the comparison signal 614. In yet another example, the D flip-flop 604 outputs a selection signal 616 (e.g., SEL) at a terminal 626 (e.g., QN), and in response, the switch 608 is closed (e.g., on). In yet another example, the capacitor 606 discharges through the closed switch 608, and the voltage signal 618 decreases in magnitude to a low value (e.g., 0). In yet another example, if the voltage signal 618 reduces in magnitude to be lower than the reference voltage 612 in magnitude, the comparator 602 outputs the comparison signal 614 at a logic high level. In yet another example, the D flip-flop 604 is set in response to the comparison signal 614.

According to another embodiment, the D flip-flop 604 receives a voltage signal 632 (e.g., AVDD) at a terminal 623 (e.g., D). For example, if a rising edge of an input signal 620 (e.g., SYNC) arrives at a terminal 624 of the D flip-flop 604, the D flip-flop 604 outputs, at a terminal 628 (e.g., Q), a clock signal 630 (e.g., CLK) that tracks the voltage signal 632 (e.g., AVDD). In another example, the clock signal 630 is at the logic high level, and the selection signal 616 is at the logic low level. In yet another example, in response, the switch 608 is opened (e.g., off), and the adaptive current 610 charges the capacitor 606 again. In yet another example, the clock signal 630 (e.g., CLK) has a same frequency as the input signal 620 (e.g., SYNC). In yet another example, the duty cycle of the clock signal 630 (e.g., CLK) is the same as or different from that of the input signal 620 (e.g., SYNC). In yet another example, the input signal 620 (e.g., SYNC) represents an external clock signal from a master LED driver or other external sources. In yet another example, the slave oscillator 312 outputs the clock signal 630 (e.g., CLK) and the voltage signal 618 (e.g., Slop) and has a K % duty cycle.

Figure 6B:
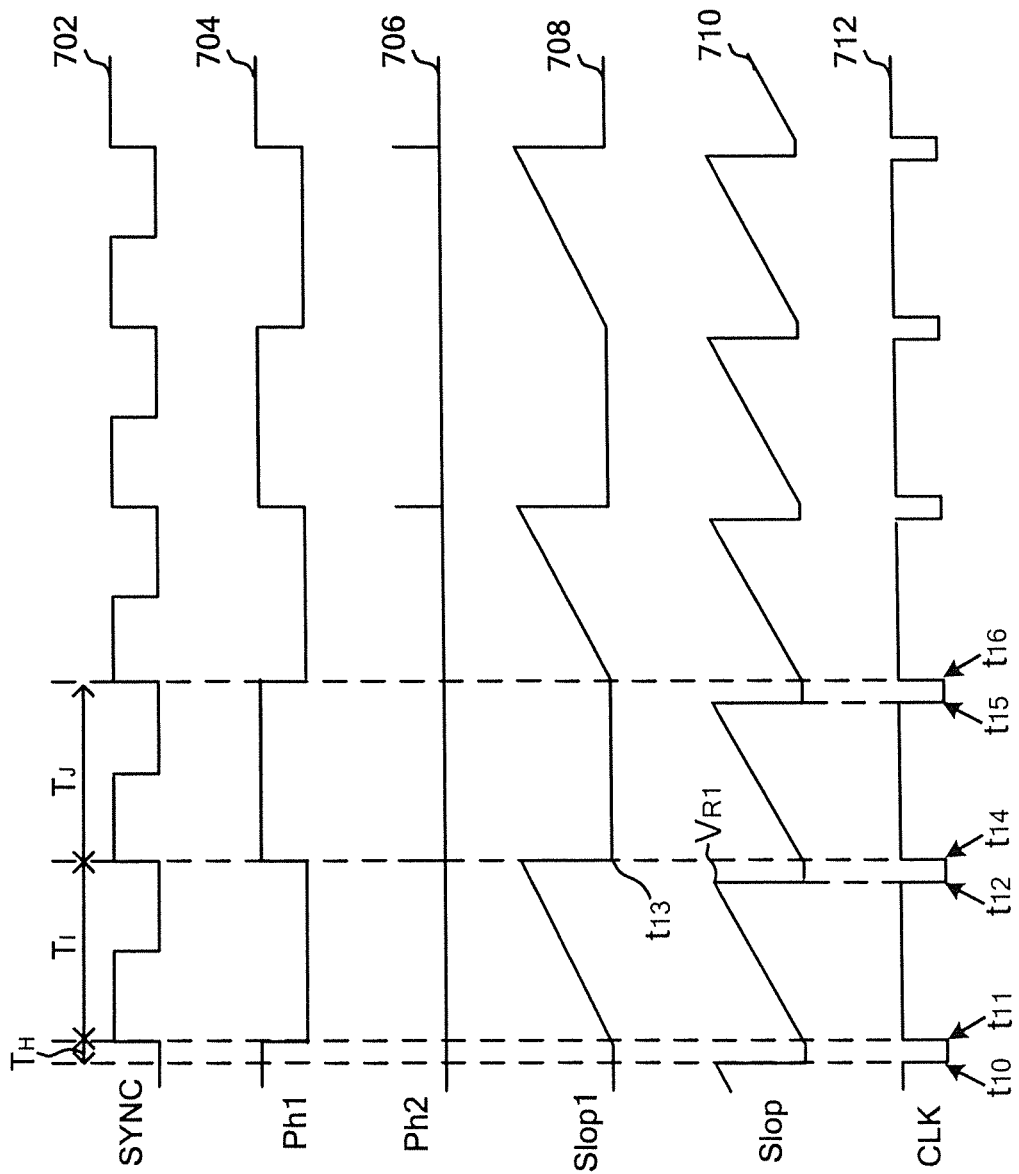
FIG. 6(b) is a simplified timing diagram for the slave oscillator as shown in FIG. 6(a) according to another embodiment of the present invention.

FIG. 6(b) is a simplified timing diagram for the slave oscillator 312 as shown in FIG. 6(a) according to another embodiment of the present invention. This diagram is merely an example, which should not unduly limit the scope of the claims. One of ordinary skill in the art would recognize many variations, alternatives, and modifications. The waveform 702 represents the input signal 620 as a function of time, the waveform 704 represents the first drive signal 676 as a function of time, and the waveform 706 represents the second drive signal 678 as a function of time. Additionally, the waveform 708 represents the voltage signal 658 as a function of time, the waveform 710 represents the slope signal 608 as a function of time, and the waveform 712 represents the clock signal 630 as a function of time.

Three time periods $T_H$, $T_I$ and $T_J$ are shown in FIG. 6(b). The time period $T_H$ starts at time $t_{10}$ and ends at time $t_{11}$, the time period $T_I$ starts at time $t_{11}$ and ends at time $t_{14}$, and the time period $T_J$ starts at time $t_{14}$ and ends at time $t_{16}$. For example, the times $t_{12}$ and $t_{13}$ are within the time period $T_I$. In another example, the time $t_{15}$ is within the time period $T_J$. In yet another example, $t_{10} \leq t_{11} \leq t_{12} \leq t_{13} \leq t_{14} \leq t_{15} \leq t_{16}$.

According to one embodiment, during the time period $T_H$, the input signal 620 (e.g., SYNC) is at the logic low level (e.g., as shown by the waveform 702). For example, the first drive signal 676 (e.g., Ph1) generated by the phase generator 647 is at the logic high level (e.g., as shown by the waveform 704). In another example, the switch 648 is closed (e.g., on) in response to the first drive signal 676, and the capacitor 660 discharges through the closed switch 648. In yet another example, the voltage signal 658 (e.g., Slop1) has a low magnitude (e.g., as shown by the waveform 708). In yet another example, the second drive signal 678 (e.g., Ph2) is at the logic low level (e.g., as shown by the waveform 706), and the switch 642 is open (e.g., off). In yet another example, in response to the input signal 620 (e.g., SYNC), the clock signal 630 (e.g., CLK) generated by the D flip-flop 604 is at the logic low level (e.g., as shown by the waveform 712). In yet another example, the selection signal 616 (e.g., SEL) generated by the D flip-flop 604 is at the logic high level, and the switch 608 is closed (e.g., on). In yet another example, the voltage signal 618 (e.g., Slop) is at the logic low level (e.g., as shown by the waveform 710).

According to another embodiment, at the beginning of the time period $T_I$ (e.g., at $t_{11}$), the input signal 620 (e.g., SYNC) changes from the logic low level to the logic high level (e.g., as shown by a rising edge of the waveform 702). For example, in response, the first drive signal 676 (e.g., Ph1) changes from the logic high level to the logic low level (e.g., as shown by the waveform 704). In another example, the switch 648 is open (e.g., off), and the current 666 (e.g., I1) charges the capacitor 660. In yet another example, the voltage signal 658 (e.g., Slop1) ramps up (e.g., as shown by the waveform 708). In yet another example, in response to the input signal 620 (e.g., SYNC), the clock signal 630 (e.g., CLK) changes from the logic low level to the logic high level (e.g., as shown by a rising edge of the waveform 712). In yet another example, the selection signal 616 changes to the logic low level, and the switch 608 is open (e.g., off). In yet another example, the adaptive current 610 charges the capacitor 606, and the voltage signal 618 (e.g., Slop) ramps up (e.g., as shown by the waveform 710).

According to yet another embodiment, the adaptive current 610 continues to charge the capacitor 606, and the magnitude of the voltage signal 618 (e.g., Slop) continues to increase. For example, if the magnitude of the voltage signal 618 exceeds that of the reference signal 612, the comparator 602 changes the comparison signal 614, and the D flip-flop 604 is reset in response to the comparison signal 614. In another example, the clock signal 630 changes from the logic high level to the logic low level (e.g., as shown by the waveform 712). In yet another example, the selection signal 616 changes from the logic low level to the logic high level. In yet another example, the switch 608 is closed (e.g., on), and the capacitor 606 discharges through the closed switch 608. In yet another example, the voltage signal 618 decreases in magnitude to a low value (e.g., 0 at $t_{12}$) as shown by the waveform 710.

According to yet another embodiment, right before the end of the time period $T_I$ (e.g., at $t_{13}$), the second drive signal 678 (e.g., Ph2) has a pulse for sampling the voltage signal 658 (e.g., as shown by the waveform 706). For example, the peak value of the voltage signal 658 (e.g., Slop1) is held at the capacitor 662 and fed into the error amplifier 644 for closed-loop control of the current 666 (e.g., I1).

According to yet another embodiment, at the beginning of the time period $T_J$ (e.g., at $t_{14}$), the input signal 620 (e.g., SYNC) changes from the logic low level to the logic high level (e.g., as shown by a rising edge of the waveform 702). For example, the first drive signal 676 (e.g., Ph1) changes from the logic low level to the logic high level (e.g., as shown by the waveform 704). In another example, the switch 648 is closed (e.g., on), and the capacitor 660 discharges through the closed switch 648. In yet another example, the voltage signal 658 (e.g., Slop1) decreases in magnitude to a low value (e.g., as shown by the waveform 708). In yet another example, in response to the input signal 620 (e.g., SYNC), the D flip-flop 604 changes the clock signal 630 (e.g., CLK) from the logic low level to the logic high level (e.g., as shown by the waveform 712). In yet another example, the selection signal 616 changes to the logic low level, and the switch 608 is open (e.g., off). In yet another example, the adaptive current 610 charges the capacitor 606 again. In yet another example, the voltage signal 618 (e.g., Slop) ramps up again (e.g., as shown by the waveform 710).

According to yet another embodiment, during the time period $T_J$, the first drive signal 676 (e.g., Ph1) keeps at the logic high level (e.g., as shown by the waveform 704). For example, the voltage signal 658 (e.g., Slop1) is held at the low value (e.g., as shown by the waveform 708). In another example, the adaptive current 610 charges the capacitor 606 to increase the voltage signal 618 (e.g., Slop) in magnitude. In yet another example, if the voltage signal 618 exceeds the reference signal 612 in magnitude (e.g., at $t_{15}$), the comparator 602 changes the comparison signal 614, and the D flip-flop 604 is reset in response to the comparison signal 614. In yet another example, the clock signal 630 changes from the logic high level to the logic low level again (e.g., at $t_{15}$) as shown by the waveform 712. In yet another example, the voltage signal 618 decreases in magnitude to the low value again (e.g., at $t_{15}$) as shown by the waveform 710.

According to another embodiment, a system for signal synchronization includes a first selection component, a first signal generator, a second signal generator, and a first gate drive component. The first selection component is configured to receive a first mode signal and generate a first selection signal based on at least information associated with the first mode signal, the first selection signal indicating a first operation mode. The first signal generator configured to, if the first selection signal satisfies one or more first conditions, receive a first input signal and generate at least a first clock signal based on at least information associated with the first input signal, the first input signal including a first input rising edge and being associated with a first input frequency, the first clock signal including a first clock rising edge and being associated with a first clock frequency. The second signal generator configured to, if the first selection signal satisfies one or more second conditions, generate at least a second clock signal, the second clock signal including a second clock rising edge and being associated with a second clock frequency. Additionally, the first gate drive component configured to, if the first selection signal satisfies the one or more first conditions, receive at least the first clock signal and output a first drive signal to a first switch based on at least information associated with the first clock signal. Further, the first gate drive component configured to, if the first selection signal satisfies the one or more second conditions, receive at least the second clock signal and output a second drive signal to the first switch based on at least information associated with the second clock signal. In addition, the first input frequency and the first clock frequency are the same. The first input rising edge and the first clock rising edge both correspond to a first time. Moreover, the one or more second conditions are different from the one or more first conditions. For example, the system is implemented according to FIG. 1(a), FIG. 1(b), FIG. 2, FIG. 3, FIG. 4(a), FIG. 4(b), FIG. 5(a), FIG. 5(b), FIG. 6(a) and/or FIG. 6(b).

According to another embodiment, a method for signal synchronization includes receiving a mode signal, processing information associated with the mode signal, and generating a selection signal based on at least information associated with the mode signal, the selection signal indicating an operation mode. Additionally, the method includes if the selection signal satisfies one or more first conditions, receiving an input signal, processing information associated with the input signal, and generating at least a first clock signal based on at least information associated with the input signal, the input signal including a first input rising edge and being associated with a first input frequency, the first clock signal including a first clock rising edge and being associated with a first clock frequency. The method further includes receiving at least the first clock signal, processing information associated with the first clock signal, and outputting a first drive signal to a first switch based on at least information associated with the first clock signal. Moreover, the method includes, if the selection signal satisfies one or more second conditions, generating at least a second clock signal, the second clock signal including a second clock rising edge and being associated with a second clock frequency, receiving at least the second clock signal, processing information associated with the second clock signal, and outputting a second drive signal to the first switch based on at least information associated with the second clock signal. Furthermore, the first input frequency and the first clock frequency are the same, and the first input rising edge and the first clock rising edge both correspond to a first time. The one or more second conditions are different from the one or more first conditions. For example, the method is implemented according to FIG. 1(a), FIG. 1(b), FIG. 2, FIG. 3, FIG. 4(a), FIG. 4(b), FIG. 5(a), FIG. 5(b), FIG. 6(a) and/or FIG. 6(b).

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for signal synchronization, the system comprising:
   a first signal generator configured to, in response to a first selection signal associated with a first operation mode satisfying one or more first conditions, generate a first clock signal based on at least information associated with a first input signal, the first input signal including an input rising edge and being associated with an input frequency, the first clock signal including a first clock rising edge and being associated with a first clock frequency;
   a second signal generator configured to, in response to the first selection signal satisfying one or more second conditions, generate a second clock signal, the second clock signal including a second clock rising edge and being associated with a second clock frequency; and
   a first gate drive component configured to,
      in response to the first selection signal satisfying the one or more first conditions, output a first drive signal to a first switch based on at least information associated with the first clock signal; and
      in response to the first selection signal satisfying the one or more second conditions, output a second drive signal to the first switch based on at least information associated with the second clock signal;
   wherein:
      the input frequency and the first clock frequency are the same;
      the input rising edge and the first clock rising edge both correspond to a first time; and
      the one or more second conditions are different from the one or more first conditions.

2. The system of claim 1 wherein:
   the first operation mode is a slave mode in response to the first selection signal satisfying the one or more first conditions; and
   the first operation mode is a master mode in response to the first selection signal satisfying the one or more second conditions.

3. The system of claim 2 wherein:
   the first selection signal satisfies the one or more first conditions in response to the first selection signal being at a logic high level; and
   the first selection signal satisfies the one or more second conditions in response to the first selection signal being at a logic low level.

4. The system of claim 1, and further comprising:
   a selection component configured to receive a mode signal and generate a second selection signal based on at least information associated with the mode signal, the second selection signal indicating a second operation mode;

a third signal generator configured to, in response to the second selection signal satisfying one or more third conditions, receive a second input signal associated with the second clock signal and generate a third clock signal based on at least information associated with the second clock signal, the third clock signal including a third clock rising edge and being associated with a third clock frequency; and a second gate drive component configured to, in response to the second selection signal satisfying the one or more third conditions, receive the third clock signal and output a second drive signal to a second switch based on at least information associated with the third clock signal;

wherein:
the second clock frequency and the third clock frequency are the same; and
the second clock rising edge and the third clock rising edge both correspond to a second time.

5. The system of claim 4 wherein:
the first operation mode is a master mode in response to the first selection signal satisfying the one or more second conditions; and
the second operation mode is a slave mode in response to the second selection signal satisfying the one or more third conditions.

6. The system of claim 4 wherein the one or more first conditions and the one or more third conditions are the same.

7. The system of claim 4 wherein:
the second clock signal is associated with a first duty cycle;
the third clock signal is associated with a second duty cycle; and
the first duty cycle and the second duty cycle are the same.

8. The system of claim 4 wherein:
the second clock signal is associated with a first duty cycle;
the third clock signal is associated with a second duty cycle; and
the first duty cycle and the second duty cycle are different.

9. The system of claim 1, and further comprising a multiplexing component configured to:
in response to the first selection signal satisfying the one or more first conditions, receive a second input signal and generate the first input signal based on at least information associated with the second input signal; and
in response to the first selection signal satisfying the one or more second conditions, receive the second clock signal from the second signal generator and generate an output signal based on at least information associated with the second clock signal.

10. The system of claim 9, and further comprising:
a selection component configured to receive a mode signal and generate a second selection signal based on at least information associated with the mode signal, the second selection signal indicating a second operation mode; and
a third signal generator configured to, in response to the second selection signal satisfying one or more third conditions, receive the output signal associated with the second clock signal and generate a third clock signal based on at least information associated with the second clock signal, the third clock signal including a third clock rising edge and being associated with a third clock frequency;

wherein:
the second clock frequency and the third clock frequency are the same; and
the second clock rising edge and the third clock rising edge both correspond to a second time.

11. The system of claim 1 wherein the first signal generator includes a first current generator configured to receive the first input signal and generate an adaptive current based on at least information associated with the first input signal, the adaptive current being proportional to the input frequency in magnitude.

12. The system of claim 11 wherein the first current generator includes:
a frequency-dividing component configured to receive the first input signal and generate a processed signal based on at least information associated with the first input signal;
a voltage generator configured to receive the processed signal and a first current and generate a first voltage signal based on at least information associated with the processed signal and the first current;
an error amplifier configured to receive the first voltage signal and a second voltage signal and generate an amplified signal based on at least information associated with a difference between the first voltage signal and the second voltage signal; and
a second current generator configured to receive the amplified signal and generate a second current and the adaptive current based on at least information associated with the amplified signal, each of the second current and the adaptive current being proportional to the first current in magnitude.

13. The system of claim 12 wherein the second current generator is further configured to affect the first current based on at least information associated with the amplified signal.

14. The system of claim 13 wherein the second current generator includes a current mirror circuit configured to mirror the second current, with a predetermined ratio, to generate the first current.

15. The system of claim 12 wherein the processed signal is associated with a processed frequency, the processed frequency being equal to half of the input frequency.

16. The system of claim 15 wherein the voltage generator includes a peak detector configured to detect a ramping signal and generate the first voltage signal based on at least information associated with the ramping signal, the ramping signal being associated with at least the processed signal and the first current, the first voltage signal representing a peak value of the ramping signal.

17. The system of claim 16 wherein the peak detector is further configured to detect the ramping signal at a detection time, the detection time preceding, by a delay period, a rising edge of the processed signal.

18. The system of claim 17 wherein the peak detector includes:
a detection signal generator configured to receive the processed signal and generate a detection signal based on at least information associated with the processed signal, the detection signal including a pulse corresponding to the detection time; and
a detection component configured to receive the detection signal and detect the ramping signal in response to at least the pulse.

19. The system of claim 1 wherein:
the first signal generator is further configured to, in response to the first selection signal satisfying the one or more first conditions, generate a first ramping signal based on at least information associated with the first input signal, the first ramping signal ramping up at a second time corresponding to the first clock rising edge;
the second signal generator is further configured to, in response to the first selection signal satisfying the one or more second conditions, generate a second ramping signal, the second ramping signal ramping up at a third time corresponding to the second clock rising edge; and the first gate drive component is further configured to, in response to the first selection signal satisfying the one or more first conditions, receive the first ramping signal and output the first drive signal based on at least information associated with the first clock signal and the first ramping signal; and in response to the first selection signal satisfying the one or more second conditions, receive the second ramping signal and output the second drive signal based on at least information associated with the second clock signal and the second ramping signal.

20. The system of claim 1 wherein the first operation mode is a slave mode in response to a mode signal related to the first selection signal being received from a floating terminal.

21. The system of claim 1 wherein the first operation mode is a master mode in response to a mode signal related to the first selection signal being received from a resistor, the resistor including a first resistor terminal and a second resistor terminal, the first resistor terminal being biased to a predetermined voltage and the second resistor terminal being configured to output the mode signal.

22. A method for signal synchronization, the method comprising:

receiving a selection signal indicating an operation mode;

in response to the selection signal satisfying one or more first conditions, receiving an input signal;

processing information associated with the input signal;

generating a first clock signal based on at least information associated with the input signal, the input signal including an input rising edge and being associated with an input frequency, the first clock signal including a first clock rising edge and being associated with a first clock frequency;

receiving the first clock signal;

processing information associated with the first clock signal;

outputting a first drive signal to a switch based on at least information associated with the first clock signal; and in response to the selection signal satisfying one or more second conditions, generating a second clock signal, the second clock signal including a second clock rising edge and being associated with a second clock frequency;

receiving the second clock signal;

processing information associated with the second clock signal; and outputting a second drive signal to the switch based on at least information associated with the second clock signal;

wherein:

the input frequency and the first clock frequency are the same;

the input rising edge and the first clock rising edge both correspond to a time; and the one or more second conditions are different from the one or more first conditions.

* * * * *